United States Patent [19]

Wilde

[11] Patent Number: 4,667,402
[45] Date of Patent: May 26, 1987

[54] METHOD FOR MICRO-PACK PRODUCTION

[75] Inventor: Ruediger Wilde, Munich, Fed. Rep. of Germany

[73] Assignee: Siemens Aktiengesellschaft, Berlin and Munich, Fed. Rep. of Germany

[21] Appl. No.: 646,144

[22] Filed: Aug. 31, 1984

[30] Foreign Application Priority Data

Oct. 7, 1983 [DE] Fed. Rep. of Germany ....... 3336606

[51] Int. Cl.$^4$ .............................................. H05K 3/34
[52] U.S. Cl. ....................................... 29/840; 29/589; 228/180.2
[58] Field of Search ......................... 29/840, 740, 589; 228/180.2, 180.1; 156/235, 238, 300, 361, 542

[56] References Cited

U.S. PATENT DOCUMENTS

| | | | |
|---|---|---|---|
| 3,698,076 | 10/1972 | Kingsley | 228/180.2 |
| 3,722,072 | 3/1973 | Beyerlein | 228/180.2 |
| 3,724,068 | 4/1973 | Galli | 228/180.2 X |
| 3,859,723 | 1/1975 | Hamer et al. | 29/840 |
| 3,871,936 | 3/1975 | Boyer et al. | 228/180.2 X |
| 3,887,996 | 6/1975 | Hartleroad et al. | 228/180.1 X |
| 4,079,509 | 3/1978 | Jackson et al. | 228/180.2 X |
| 4,247,590 | 1/1981 | Hayakawa et al. | 228/180.2 X |
| 4,526,646 | 7/1985 | Suzuki et al. | 156/542 X |

FOREIGN PATENT DOCUMENTS

| | | | |
|---|---|---|---|
| 180030 | 10/1983 | Japan | 29/589 |
| 180031 | 10/1983 | Japan | 29/589 |

Primary Examiner—Howard N. Goldberg
Assistant Examiner—Carl J. Arbes
Attorney, Agent, or Firm—Hill, Van Santen, Steadman & Simpson

[57] ABSTRACT

A wafer is adhered to a foil with an adhesive which is resistant, for a short time, to soldering temperature and the wafer is then divided into chips. After the soldering of the chip to a carrier strip, a pin or spindle beneath the chip penetrates the foil and removes the chip from the foil. The invention has the particular advantage that few method steps are necessary and that the soldering temperature may be synchronized exactly with the soldering operation.

2 Claims, 5 Drawing Figures

METHOD FOR MICRO-PACK PRODUCTION

BACKGROUND OF THE INVENTION

1. Field of the Invention

The present invention relates to a method for producing micropacks in which chips of a divided or split wafer adhered to a first carrier are soldered to a carrier strip.

2. Description of the Prior Art

In micropack production, foils and a strip carrier, for example made of a film material, are applied and partially tin-coated or tin-plated, so that through an etching operation connections result for inner chip soldering and for outer chip soldering on a circuitboard. On the upper side of a chip are located well-solderable peaks, which are soldered in by a heat pulse in the carrier strips. In the case of the method steps which relate to the path of the chips from the wafer up to the soldering onto the strip carriers, it must be taken into consideration that the chips, on the one hand, have only a very small size, or very sensitive to mechanical or thermal effects, and, on the other hand, occur in a large number of pieces. This makes it necessary that during production, each access to a chip must take place very accurately, i.e. that expensive adjustments are to be carried out, and that the loads on the switching circuit are to be kept low.

SUMMARY OF THE INVENTION

The object of the present invention, therefore, is to provide a method of the type generally set forth above, which is distinguished by a low number of method steps, whereby the mechanical and thermal loads are low to the utmost. The above object is achieved in a method of the type described which is characterized in that the wafer is applied to the adhesive which is resistant to soldering temperature for a short time, having penetrable foil-type first carriers, that the wafer is parted for a thinning and separation of the chips, that the soldering connections are aligned in correlation with a chip on the carrier strip with the corresponding soldering peaks of the chip, that solder connections are then produced, that a pin or spindle is aligned on the rear side of the chip beneath the foil-type carrier and that the foil-type carrier is penetrated and the chip removed from the foil-type carrier by a relative movement between the pin and the foil-type carrier.

The present invention has the advantage that the soldering temperature may be synchronized optimally with the soldering process. Impurities through adhesive residues fall away, because upon removing of the chips, the adherent layer remains on the first carrier. A subsequent purification of adhesive residues may accordingly be eliminated.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 1:
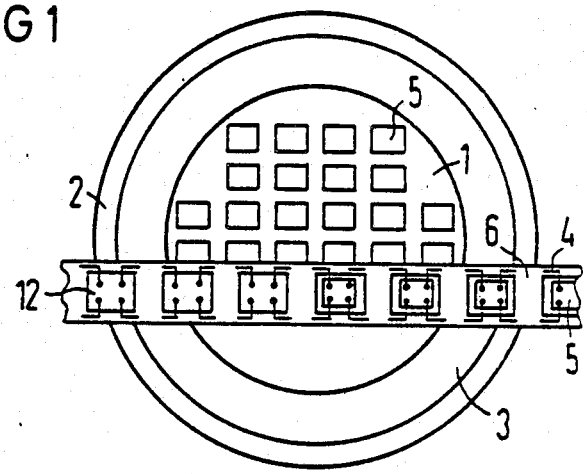
FIG. 1 is a diagrammatic plan view of a laminar chip carrier and of a carrier strip.

Referring to FIG. 1, a wafer 1 is applied to a laminar first carrier 3 which is fixedly clamped in an expansion ring 2. The carrier 3 comprises a foil-type material which has an adhesive on its surface which serves the purpose of holding the wafer 1. The adhesive layer comprises, for example, an electrically-conductive adhesive. Further, the carrier 3 is at least for a short time resistant to soldering temperature, so that a soldering free from difficulty may be carried out. The strength or resistance of the carrier 3 is such that it may be penetrated by a sharp pin or spindle. A polyimide foil has, for example, all of these characteristics.

In a second method step, the wafer 1 is divided or split by sawing so that separated chips 5 adhere individually to the first carrier 3. Subsequently, the carrier 3 and a strip-shaped carrier 6 with applied connection paths 4 are aligned relative to one another, that with reference to a chip, soldering connections between soldering peaks 11 on the chip 5 and the free ends of the connection paths 4 are produced on the carrier 6. The connection paths project into recesses 12 of the carrier strip 6 which are provided for receiving the chips 5.

Figure 2:
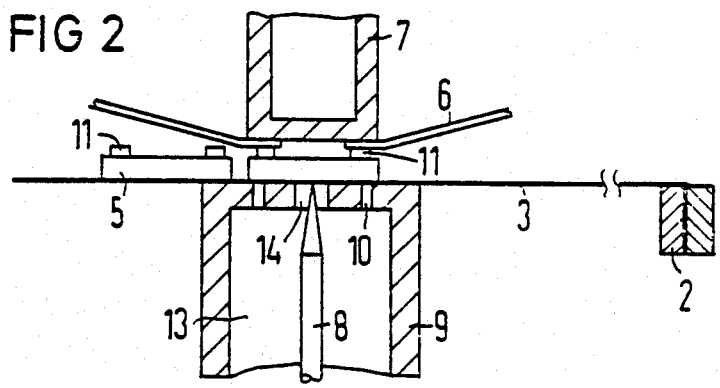
FIGS. 2-5 are sectional elevation views illustrating progressive steps of the method of the invention.

In the following method step shown in FIG. 2, beneath the chip 5, on whose soldering peaks the soldering connections are aligned, a piston or stamp 9 is brought in contact with the first carrier 3. The contact surface of the piston or stamp 9 provided with bores which extend into a cavity within the interior of the piston or stamp 9. This cavity 13 is acted on with a vacuum which causes the carrier 3 to be pressed tightly on the piston or stamp 9. On the opposite side of the chip 5 is disposed a soldering die or stamp 7 with which, by way of heat pulses, soldering connections are produced between the peaks 11 and the paths 4.

Within the piston or stamp 9 is a pin or spindle 8, whose tip is directed through a further opening 14 in the piston or stamp 9 on the rear side of the chip 5.

Figure 3:
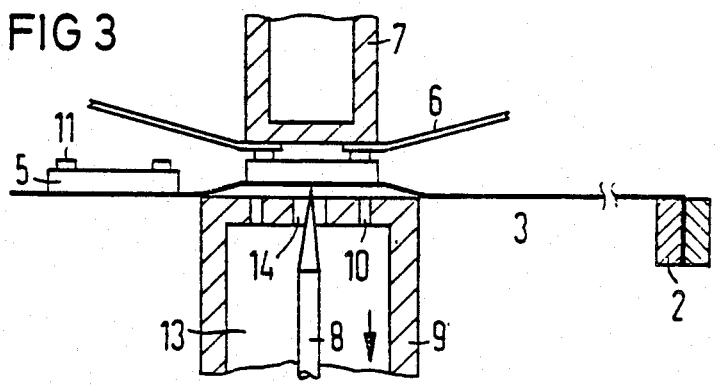

After cooling of the soldering points, according to FIG. 3, the piston or stamp 9, together with the drawn-in carrier 3, is moved away from the soldering stamp 7 in the direction of the arrow. The pin or spindle 8 does not change its position with this movement.

Figure 4:
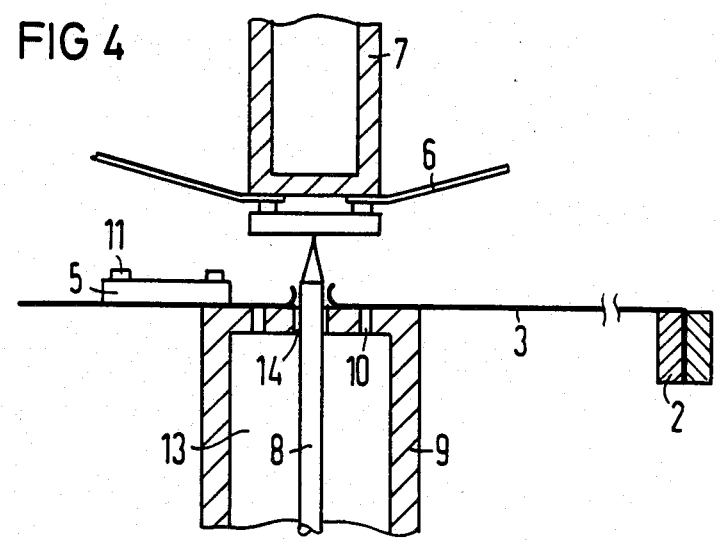

Through this relative movement between the carrier 3 and the pin or spindle 8 extending perpendicularly thereto, the tip of the pin or spindle 8 is moved through a bore 14 and pierces the carrier 3. FIG. 4 illustrates how the chip is then released from the carrier 4, whereby it is fixed in its position by the pressure between the pin or spindle 8 and the soldering stamp 7.

Figure 5:
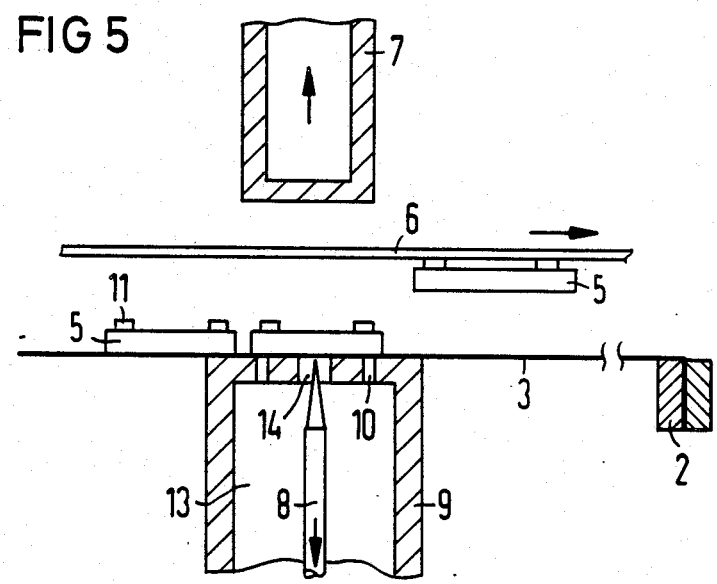

FIG. 5 illustrates how, after the release of the chip 5 from the carrier, a thrust takes place of the soldering stamp 7 in the direction of the arrow and how the pin or spindle 8 is lowered. In conclusion, a movement then takes place of the carrier strip 6 in the direction of the respective arrow.

Although I have described my invention by reference to a particular illustrative embodiment thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A method of producing micropacks, comprising the sequential steps of:
   (a) applying a chip, having predetermined spaced solder locations, to an adhesive-coated first carrier;
   (b) moving the first carrier and the chip over a hollow first member which includes at least first and second bores;
   (c) applying a negative pressure to the hollow first member to suck the first carrier thereagainst via the bores;
   (d) moving a second carrier, having electrical connections spaced corresponding to the predetermined spacing of the solder locations, into alignment with the chip;
   (e) moving a soldering second member into engagement with the second carrier and applying heat pulses therewith to solder the electrical connections to the respective solder locations;
   (f) moving a pin through one of the boes in the hollow first member, by moving such member away from the first carrier and maintaining the pin fixed, to pierce the first carrier, to engage and release the chip from the adhesive and to align the solder locations with the electrical conductors; and
   (g) moving the second carrier and the attached chip away from the hollow first member.

2. A method of producing micropacks, comprising the sequential steps of:
   (a) supporting a plurality of chips, each having solder locations, on an adhesive layer carried by a first carrier;
   (b) moving the first carrier in a step-by-step manner to position each supported chip over a perforate anvil for a predetermined dwell time;
   (c) supporting a plurality of electrical conductors, arranged corresponding to the solder locations, on a second carrier;
   (d) moving the second carrier over and in synchronism with the first carrier to align electrical conductor and solder locations;
   (e) applying a vacuum through the perforate anvil during the dwell times to releasably secure the first carrier to the anvil;
   (f) during each dwell time, moving a soldering head toward the anvil to clamp the first and second carriers and their supported elements therebetween;
   (g) during each dwell time applying heat pulses to solder the electrical conductors to the solder locations;
   (h) during each dwell time moving the soldering head away from the anvil; and
   (i) during each dwell time, stripping the soldered chip from the adhesive and thereby supporting the same with the second carrier, including
      (i1) moving a pin through the anvil to align the solder locations with the electrical conductors to pierce the first carrier and engage and release the chip from the adhesive.

* * * * *